United States Patent
Gumpert (10) Patent No.: US 9,589,394 B2
(45) Date of Patent: Mar. 7, 2017

(54) DETERMINING THE SOURCE OF A GROUND OFFSET IN A CONTROLLER AREA NETWORK

(71) Applicant: GM GLOBAL TECHNOLOGY OPERATIONS LLC, Detroit, MI (US)

(72) Inventor: David B. Gumpert, Farmington Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 14/800,796

(22) Filed: Jul. 16, 2015

(65) Prior Publication Data

US 2017/0018123 A1   Jan. 19, 2017

(51) Int. Cl.
*G07C 5/08* (2006.01)
*G01R 35/00* (2006.01)
*G01R 31/00* (2006.01)
*G01R 31/08* (2006.01)
*G07C 5/02* (2006.01)

(52) U.S. Cl.
CPC ............ *G07C 5/08* (2013.01); *G01R 31/005* (2013.01); *G01R 31/088* (2013.01); *G07C 5/02* (2013.01)

(58) Field of Classification Search
CPC G07C 5/08; B60L 3/0046; B60L 1/00; G05B 15/02; G05B 19/048; G01R 35/00; G01R 31/343; G11C 16/0483; H02J 7/0068; H04L 67/12; F02P 17/12; F02P 19/027; G06Q 40/00
USPC ...... 701/33.4, 34.4, 32.7; 700/295; 324/433; 702/64; 713/300; 709/218
See application file for complete search history.

(56) References Cited

U.S. PATENT DOCUMENTS

| | | | | |
|---|---|---|---|---|
| 5,646,865 A | * | 7/1997 | Alfaro | G05B 19/048 701/32.7 |
| 7,188,597 B2 | * | 3/2007 | Rodriguez | F02P 19/027 123/145 A |
| 7,557,459 B2 | * | 7/2009 | Yamashita | B60L 1/00 307/9.1 |
| 2006/0030993 A1 | * | 2/2006 | Goodell | F02P 17/12 701/114 |
| 2009/0037311 A1 | * | 2/2009 | Omar | G06Q 40/00 705/35 |
| 2011/0074435 A1 | * | 3/2011 | Mizoguchi | G01R 35/00 324/433 |
| 2013/0159466 A1 | * | 6/2013 | Mao | H04L 67/12 709/218 |

(Continued)

OTHER PUBLICATIONS

Xinyu, D., U.S. Appl. No. 62/154,879, filed Apr. 30, 2015.

*Primary Examiner* — Yuri Kan
(74) *Attorney, Agent, or Firm* — Lorenz & Kopf, LLP (57) ABSTRACT

Disclosed herein are a system and a related computer-executed method of locating a source of a ground offset in a network of electronic devices interconnected by a communication bus. An exemplary method detects signal voltages on the communication bus that are indicative of a ground offset condition, and saves voltage timestamps for the detected signal voltages such that each detected signal voltage has a respective voltage timestamp. Message timestamps are added to messages on the communication bus, such that each message has a respective message timestamp. The message timestamps are compared against the voltage timestamps to identify at least one of the electronic devices as a ground offset source.

14 Claims, 5 Drawing Sheets

(56) References Cited

U.S. PATENT DOCUMENTS

| | | | |
|---|---|---|---|
| 2014/0047248 A1* | 2/2014 | Heo | H02J 7/0068 |
| | | | 713/300 |
| 2014/0229131 A1* | 8/2014 | Cohen | G11C 16/0483 |
| | | | 702/64 |
| 2015/0198669 A1* | 7/2015 | Larsson | G01R 31/343 |
| | | | 324/765.01 |
| 2015/0236508 A1* | 8/2015 | Divan | G05B 15/02 |
| | | | 700/295 |
| 2016/0031324 A1* | 2/2016 | Kim | B60L 3/0046 |
| | | | 701/34.4 |

* cited by examiner

DETERMINING THE SOURCE OF A GROUND OFFSET IN A CONTROLLER AREA NETWORK

TECHNICAL FIELD

Embodiments of the subject matter described herein relate generally to vehicle diagnostic systems. More particularly, embodiments of the subject matter relate to a methodology for localizing ground offsets associated with an electronic device, such as an electronic control unit of a vehicle.

BACKGROUND

A modern automobile has numerous electronic control units (ECUs) configured to control various vehicle subsystems, such as the engine, transmission, airbags, antilock braking, cruise control, electric power steering, audio systems, windows, doors and mirror adjustments, to name but a few. Some of these subsystems are independent, while others need to exchange data among themselves during the normal operation of the vehicle. When an ECU fails or is operational but faulty, the vehicle may exhibit poor performance or be completely disabled.

An ECU onboard a vehicle may suffer from a ground offset condition. A ground offset means that an expected reference voltage (e.g., zero volts) of an ECU has shifted. Thus, if the same signal voltage is measured relative to different reference voltages, then different measured values will be obtained. In an ideal network of ECUs, all of the reference voltages are identical such that all signal voltage measurements are consistent relative to one another. Ground offsets in vehicle ECUs can result in inconsistent vehicle operation, due to changing electrical loading. Moreover, ground offsets tend to worsen over time (perhaps rendering the stricken ECU inoperable).

Accordingly, it is desirable to have an onboard system and/or a diagnostic tool that can check the ground integrity of the ECUs onboard a host vehicle. In addition, it is desirable to have an efficient and automated methodology for identifying and locating the source of a ground offset in a network of ECUs. Furthermore, other desirable features and characteristics will become apparent from the subsequent detailed description and the appended claims, taken in conjunction with the accompanying drawings and the foregoing technical field and background.

BRIEF SUMMARY

A method of locating a source of a ground offset, in a network of electronic devices interconnected by a communication bus, is presented herein. The method detects signal voltages on the communication bus that are indicative of a ground offset condition, and saves voltage timestamps for the detected signal voltages. Accordingly, each detected signal voltage has a respective voltage timestamp associated therewith. The method continues by adding message timestamps to messages on the communication bus, such that each message has a respective message timestamp associated therewith. The message timestamps are compared against the voltage timestamps to identify at least one of the electronic devices as a ground offset source.

Also presented herein is a system for diagnosing a controller area network (CAN) onboard a host vehicle. The CAN includes a plurality of electronic control units (ECUs) interconnected by a CAN communication bus. The system includes a processor device and a storage medium associated with the processor device. The storage medium stores processor-executable instructions that, when executed by the processor device, are capable of performing the method of locating a source of a ground offset in the CAN.

Also presented herein is a tangible and non-transitory computer readable storage medium having executable instructions stored thereon that, when executed by a processor device, are capable of performing the method of locating a source of a ground offset.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Techniques and technologies may be described herein in terms of functional and/or logical block components, and with reference to symbolic representations of operations, processing tasks, and functions that may be performed by various computing components or devices. Such operations, tasks, and functions are sometimes referred to as being computer-executed, computerized, software-implemented, or computer-implemented. It should be appreciated that the various block components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

When implemented in software, various elements of the systems described herein are essentially the code segments or computer-executable instructions that perform the various tasks. In certain embodiments, the program or code segments are stored in a tangible processor-readable medium, which may include any medium that can store or transfer information. Examples of a non-transitory and processor-readable medium include an electronic circuit, a microcontroller, an application-specific integrated circuit (ASIC), a semiconductor memory device, a ROM, a flash memory, an erasable ROM (EROM), a floppy diskette, a CD-ROM, an optical disk, a hard disk, or the like.

The system and methodology described below can be utilized to localize ground offsets in a network of electronic devices interconnected by a communication bus, such as an onboard vehicle communications network. The ground offset localization technique relies on bus voltage measurements and timestamping of the voltage measurements. While the approach and methodology are described below with respect to vehicle communications, one of ordinary skill in the art appreciates that an automotive application is merely exemplary, and that the concepts disclosed herein may also be applied to any other suitable communications system such as, for example, general industrial automation applications and gaming, to name a few.

The term "vehicle" as described herein is also to be construed broadly to include not only a passenger car, but any other vehicle including, but not limited to, motorcycles, trucks, sports utility vehicles (SUVs), recreational vehicles (RVs), marine vessels, and aircraft. The system and method described herein may be implemented onboard a host vehicle (e.g., implemented in an ECU or any onboard processing module), or in an off-board diagnostic tool, device, or component that can be coupled to the vehicle network using a suitably configured interface. In other words, the method described herein may be implemented on a service tool rather than on an ECU or gateway module. In addition, although described below with respect to a communications system that incorporates ECUs arranged as a controller area network (CAN), one of ordinary skill in the art appreciates that the method disclosed herein is equally applicable to any communication system utilizing a non-isolated multi-drop bus.

Figure 1:
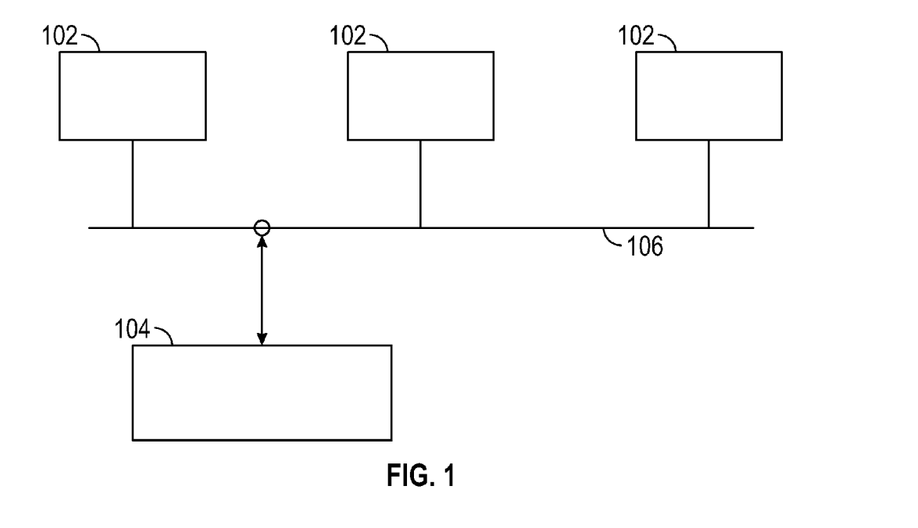
FIG. 1 is a simplified schematic representation of a network of ECUs and a diagnostic system.

Referring now to the drawings, FIG. 1 is a simplified schematic representation of a network of electronic devices. Although not always required, the exemplary embodiment described here includes a network of ECUs 102 onboard a host vehicle (not shown). The ECUs may include the following common modules, without limitation: an engine control module; a transmission control module; a body control module; a telematics system control module; a rear differential control module; an electronic parking brake module; a human machine interface module; and an electronic brake control module. FIG. 1 also shows a diagnostic system 104, which may be realized as any of the following, without limitation: an onboard module (such as another ECU); an onboard central gateway module that communicates with a plurality of different networks onboard the vehicle; an off-board or external diagnostic tool, device, or subsystem; or any suitably configured and compatible computer device. The ECUs 102 are interconnected by a communication bus 106. FIG. 1 depicts the communication bus 106 as a single line. In practice, however, the communication bus 106 can be realized as a two-wire bus, such as that utilized in a two-wire CAN bus. For simplicity and ease of illustration, FIG. 1 shows one CAN having three ECUs. In practice, however, a vehicle can include many more than three ECUs (having 30 or more ECUs is not unusual). It should be appreciated that the host vehicle may include a plurality of different CANs, and that any given ECU 102 may be a member of one or more CANs.

In a vehicle, the most widely established network bus protocol is the CAN, which is a multi-master broadcast serial bus standard designed to allow microcontrollers and devices to communicate with each other within the host vehicle. The most common physical layer standard in the CAN protocol, used here as one suitable example, is the two-wire balanced signaling scheme defined by ISO-11898-2 (referred to as a high speed CAN). This standard specifies a two-wire differential bus wherein the number of nodes is limited by the electrical bus load. The two bus wires are identified as CAN High and CAN Low, and each ECU that is a member of the CAN is connected to the two bus wires. In certain exemplary non-limiting embodiments, the common mode voltage ranges from −2.0 volts on CAN Low to 7.0 volts on CAN High. More specifically, the voltage on CAN Low is generally in the range of about 1.5 to 2.5 volts, while the voltage on CAN High is generally in the range of about 2.5 to 3.5 volts.

Each node (i.e., an ECU 102) on the communication bus 106 is able to send and receive messages, but not simultaneously. Each message (also referred to as a CAN frame) includes data, along with some identifying information that can be read and interpreted as needed. The identifying information is conveyed in the arbitration field of the message. The arbitration field also serves as a priority identifier that represents the priority of the message, wherein messages with lower priority identifier values have a higher priority than messages with higher priority identifier values, and are therefore transmitted first. A priority identifier must be uniquely assigned to only one ECU, otherwise two different ECUs could win arbitration at the same time, which would cause bus errors. Consequently, the priority identifier also functions as a source identifier that is uniquely mapped to one and only one ECU (that said, a given ECU can have more than one source identifier uniquely mapped thereto).

The CAN protocol specifies two logical states: recessive and dominant. A differential voltage is used to represent recessive and dominant states (i.e., bits). In the recessive state (logical 1), the differential voltage on CAN High and CAN Low is less than a minimum threshold. In the dominant state (logical 0), the differential voltage on CAN High and CAN Low is greater than a minimum threshold. Data in a CAN network is transmitted in messages, which are more commonly referred to as frames. A given CAN frame is separated from preceding frames by a bit field known as an inter-frame space, which includes at least three consecutive recessive bits. Following these consecutive recessive bits, if a dominant bit is detected, that bit is regarded as a "start of frame" bit for the next frame.

Each ECU 102 generally includes a processor device or a microcontroller, a suitably configured memory or storage device, a CAN controller, and a transceiver. The ECU microcontroller controls the relay of messages and is often connected to sensors, actuators, and control devices. The CAN controller is often an integral part of the microprocessor and is configured to store the received serial bits from the communication bus 106 until an entire message is available, which can then be fetched by the ECU microcontroller. The CAN controller is also configured to receive messages transmitted by the microprocessor, which are then serially transmitted as bits onto the communication bus 106. The transceiver converts the data stream from the levels utilized by the CAN into levels that the CAN controller can process, and vice versa.

Figure 2:
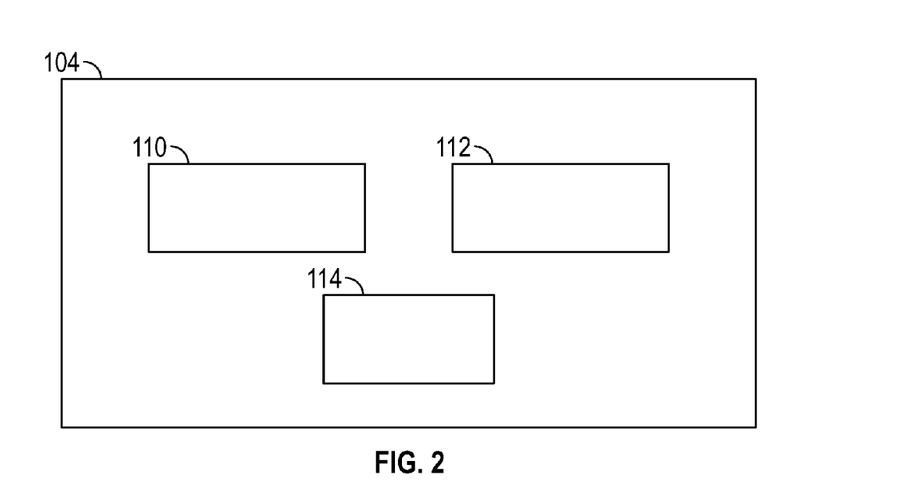
FIG. 2 is a simplified schematic representation of the diagnostic system shown in FIG. 1.

The diagnostic system 104 represents an embodiment of a system for diagnosing a CAN onboard a host vehicle to locate the source of ground offsets. FIG. 2 is a simplified schematic representation of the diagnostic system 104. As mentioned previously, the diagnostic system 104 can be realized as an onboard component, subsystem, or module, or it can be realized as an off-board device or component that can be coupled to the communication bus 106 as needed to perform the functions described in more detail below. Accordingly, FIG. 2 depicts an overly simplified representation of the diagnostic system 104 that applies regardless of the manner in which the diagnostic system 104 is implemented. In some embodiments, the diagnostic system 104 is realized as (or is implemented in) a central gateway module onboard the host vehicle, wherein the central gateway module is coupled to the ECUs 102 via the communication bus 106. The central gateway module may also serve as a centralized interface that communicates with a plurality of different CANs onboard the host vehicle. Thus, the central gateway module can perform diagnostic procedures (including ground offset detection) for more than one CAN onboard the vehicle. In other embodiments, the diagnostic system 104 is realized as (or is implemented in) a diagnostic tool external to the host vehicle (i.e., an off-board tool). The diagnostic tool includes a suitably configured interface to establish communication with the communication bus 106, as depicted in FIG. 1. For example, the diagnostic tool can be realized as a computer system (e.g., a laptop, tablet, or mobile device) having a connection cable that is compatible with a plug, jack, or interface onboard the host vehicle.

The diagnostic system 104 generally includes, without limitation, at least one processor device 110 and at least one storage medium 112 that is associated with the processor device 110. In some embodiments, the processor device 110 and the storage medium 112 are realized in a single integrated circuit component, such as a microcontroller or an ASIC. The diagnostic system 104 may also include certain input/output (I/O) features 114. In practice, the diagnostic system 104 can include or cooperate with additional elements, devices, components, or features that support additional functionality or that support the techniques and methodologies described herein.

The storage medium 112 (or another memory device or component) can represent a tangible and non-transitory electronic storage medium having processor-executable instructions stored thereon. When such instructions are executed by a processor architecture including at least one processor device (such as the processor device 110), they are capable of performing the various methods, processes, and functions described in more detail herein. More particularly, the processor device 110 executes instructions stored in the storage medium 112 to perform a method of locating a source of a ground offset in a network of electronic devices (e.g., a vehicle-based CAN). In this regard, the diagnostic system 104 can be programmed to execute instructions that effectively transform what might be a general purpose computing platform into a specialized piece of equipment that supports the techniques, technologies, and methodologies presented herein. This is particularly applicable to an external off-board implementation that might leverage a computer device.

The I/O features 114 can be utilized to initiate or control the functionality of the diagnostic system 104 and/or to generate suitably formatted outputs as needed. In practice, the I/O features 114 may include, for example, a CAN transceiver, an analog-to-digital converter, and the like. In this regard, the I/O features 114 can identify one or more of the ECUs as a potential source of a ground offset. In certain embodiments, the I/O features 114 can generate diagnostic trouble codes that indicate ground offset conditions detected by the diagnostic system 104. In some embodiments, the I/O features 114 are used to issue alerts or warning messages, to generate diagnostic reports, to display test results, or the like. These and other reporting functions can be supported by the diagnostic system 104 as needed, and as appropriate to the particular embodiment.

Figure 3:
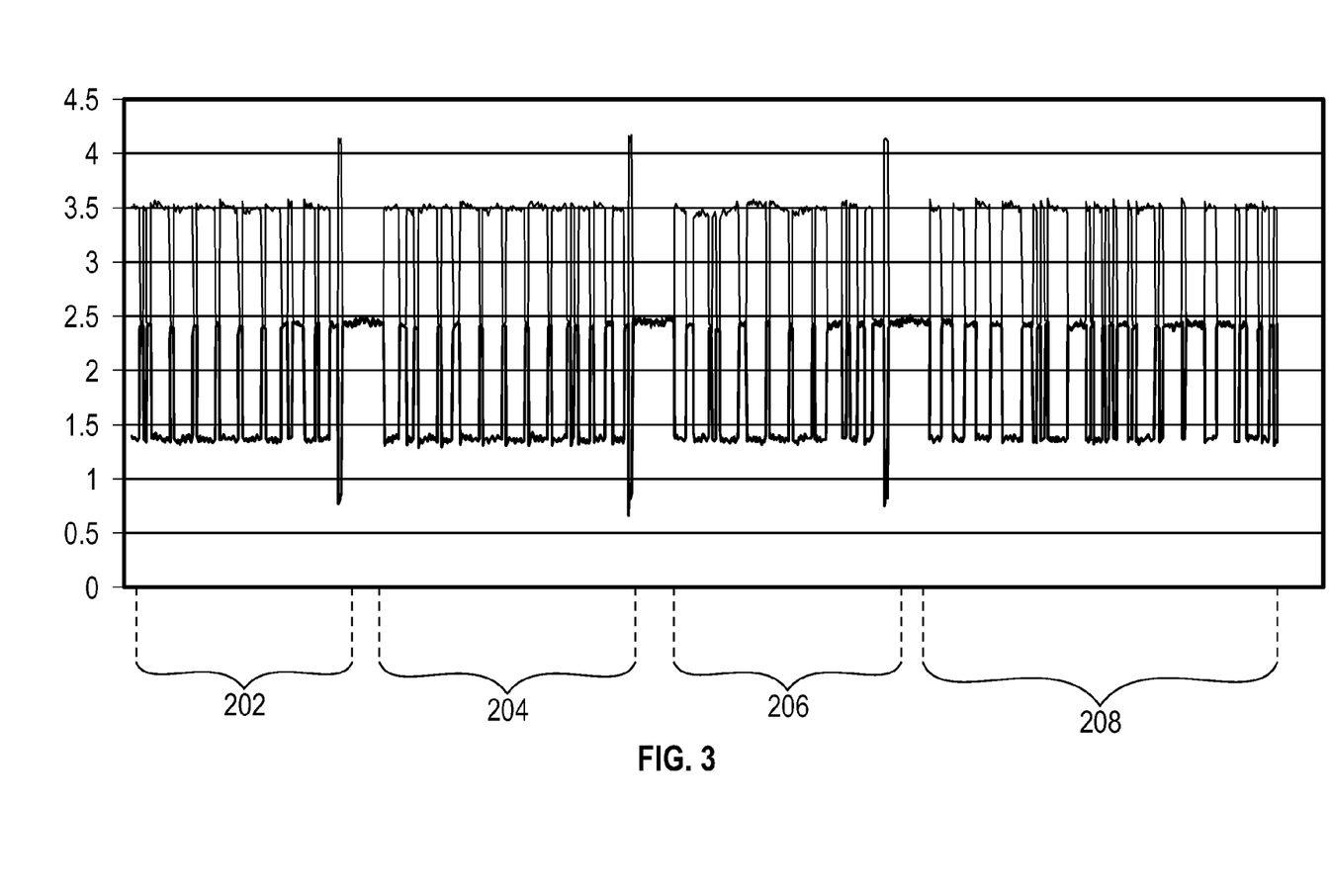
FIG. 3 is a diagram that illustrates signal voltage characteristics of a healthy network of ECUs.

The diagnostic system 104 executes computer-readable instructions to monitor the voltage characteristics of the messages on the communication bus 106 for purposes of identifying an ECU with a ground offset. In this regard, FIG. 3 is a diagram that illustrates signal voltage characteristics of a healthy CAN having multiple ECUs. In FIG. 3, the upper "half" of the voltage signal corresponds to CAN High, and the lower "half" of the voltage signal corresponds to CAN Low (which is the inverse of CAN High). FIG. 3 depicts a typical and expected CAN voltage signature when all ECU grounds are normal with an average frame and inter-frame voltage being about 2.5 volts.

FIG. 3 shows the voltage signal characteristics for four CAN messages: a first message 202; a second message 204; a third message 206; and a fourth message 208. The end of each message is marked by a spike in the voltage signal, which is caused by other ECUs acknowledging the frame, and which precedes the inter-frame space that appears before the next message. Notably, the peak in-frame voltage in each of the four messages is relatively stable and consistent at about 3.5 volts for CAN High and about 2.5 volts for CAN Low. Moreover, the average frame voltage for each of the messages is relatively stable and consistent at about 2.5 volts. These characteristics are indicative of properly grounded ECUs. In other words, there is no ground offset in any of the ECUs that originated the four messages depicted in FIG. 3.

For the exemplary embodiment described herein, CAN messages are transmitted at a rate of 500 kBd. In other embodiments, however, different rates can be utilized, e.g., 92.5 kBd, 125 kBd, 250 kBd. The actual rate utilized by the system may vary from one application to another. Moreover, the length of the CAN messages generated by the ECUs need not be the same. Instead, the length of a CAN message may vary between zero and eight bytes depending on the amount of data that needs to be transmitted. This can be observed in FIG. 3. At 500 kBd, a CAN frame containing eight data bytes using standard addressing, consisting of 128 total bits, will take 216 microseconds to transmit. A CAN frame containing eight data bytes using extended addressing, consisting of 108 total bits, will take 256 microseconds to transmit. The exemplary embodiment presented herein assumes that CAN messages can be transmitted in 250 microseconds or less. In practice, the CAN messages handled by the system described herein are at least 88 microseconds long.

FIG. 3 shows four messages in quick succession for ease of understanding. In practice, the different ECUs in the CAN transmit their respective messages in accordance with different schedules. Furthermore, the message transmission rate can vary from one ECU to another. For example, a given ECU can transmit a given message once every 25, 50, 100, or 250 milliseconds. These transmission periods are merely exemplary, and an embodiment of the system can utilize different periods if so desired. Accordingly, some ECUs generate a higher percentage of the messages transmitted on the CAN, and other ECUs generate a relatively low amount of the message traffic.

Figure 4:
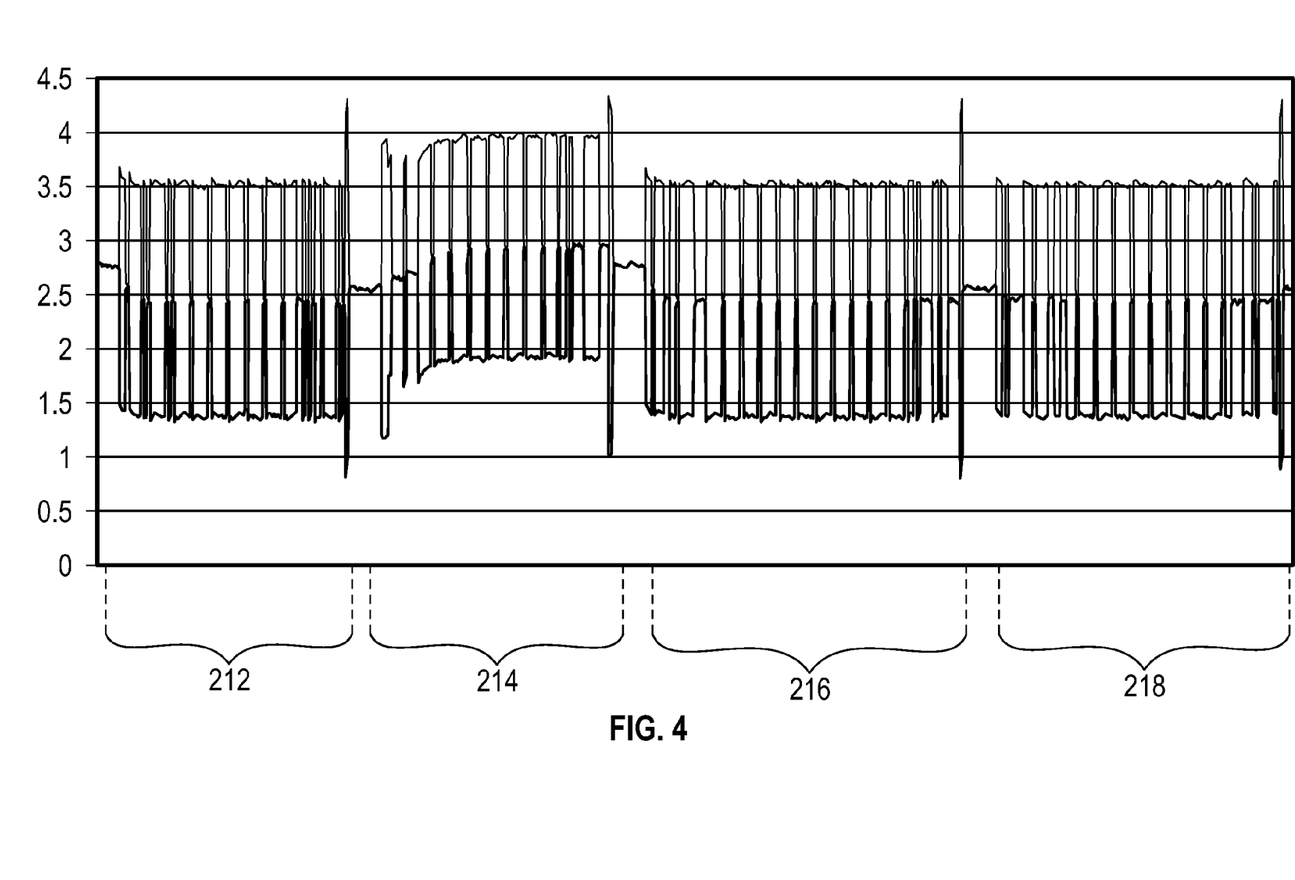
FIG. 4 is a diagram that illustrates signal voltage characteristics of a network of ECUs having a ground offset condition.

In contrast to that shown in FIG. 3, FIG. 4 is a diagram that illustrates signal voltage characteristics that are indicative of a ground offset condition. Here, the first message 212, the third message 216, and the fourth message 218 are representative of properly grounded conditions (they resemble the healthy voltage characteristics shown in FIG. 3). The second message 214, however, has voltage characteristics that are indicative of a ground offset condition. For this example, the ECU that originated the message 214 has its ground voltage pulled up (its ground voltage is greater than zero). This ground offset causes both CAN High and CAN Low to be pulled up when the faulty ECU transmits a message. The ground offset condition causes the second message 214 to be upwardly shifted relative to the levels of the other messages. For this particular example, the peak in-frame voltage of the second message 214 is approximately 4.0 volts for CAN High (compared to the healthy level of 3.5 volts) and 3.0 volts for CAN Low (compared to the healthy level of 2.5 volts). The average in-frame voltage of the second message 214 has also been shifted upward by about 0.5 volts to a value of almost 3.0 volts.

Figure 5:
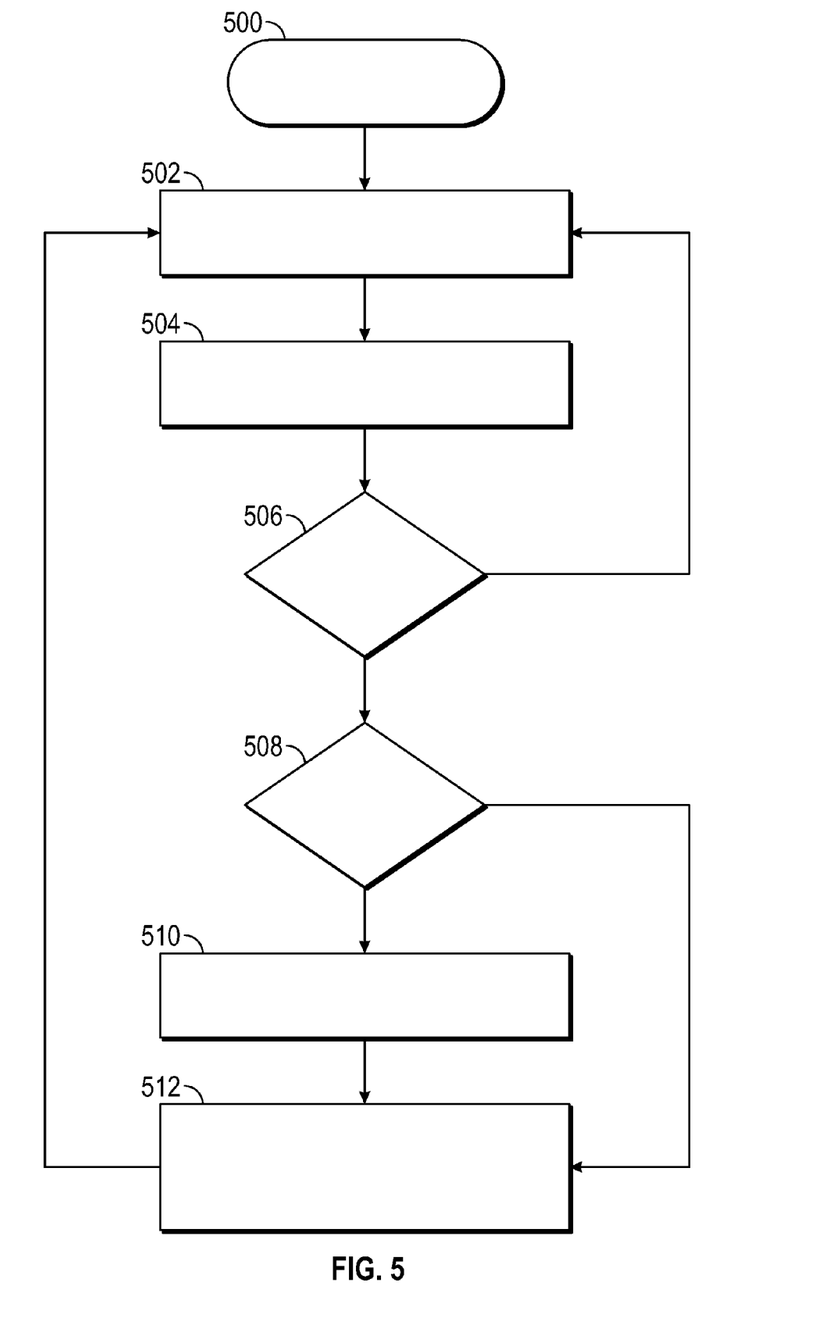
FIG. 5 is a flow chart that illustrates an exemplary embodiment of a bus voltage monitoring process.
Figure 6:
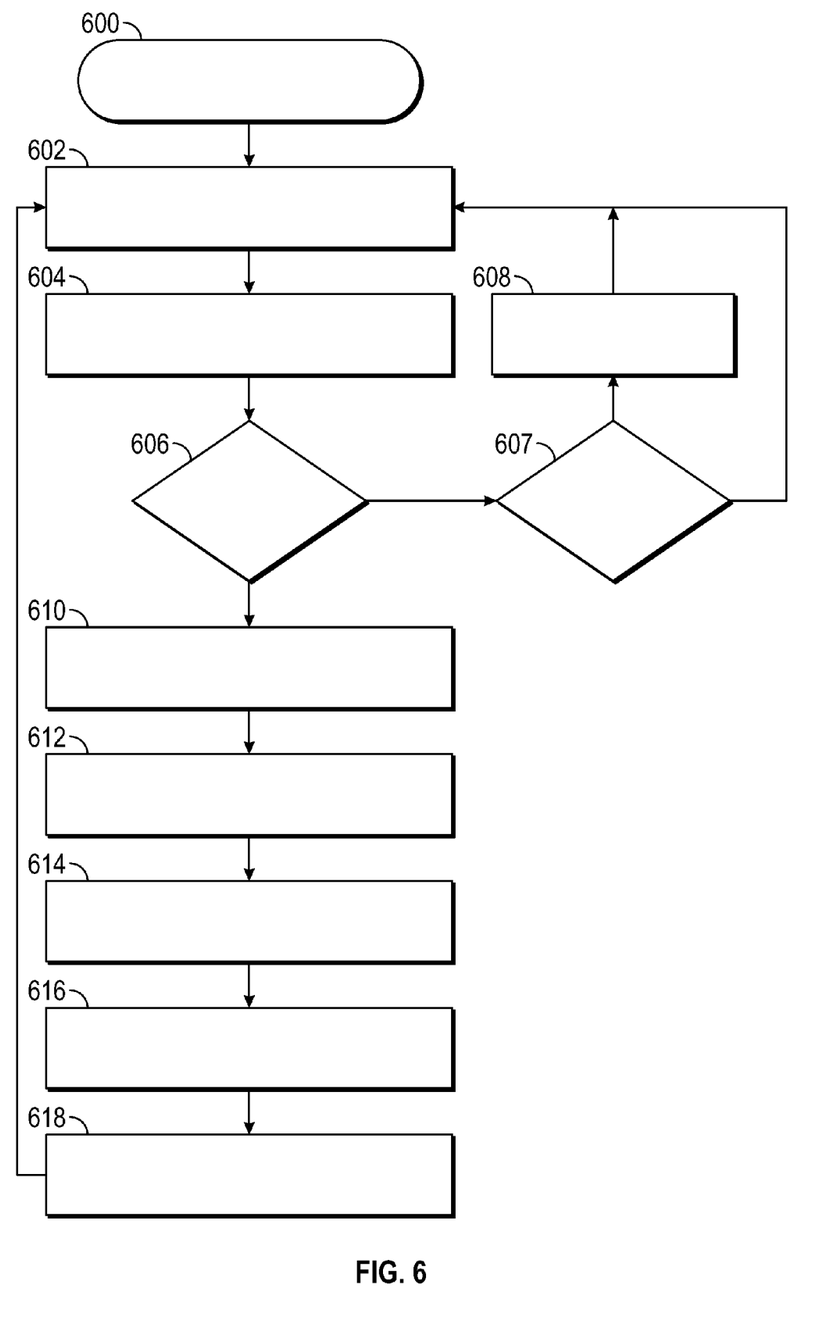
FIG. 6 is a flow chart that illustrates an exemplary embodiment of a message timestamping and analysis process.

Although the ground offset shown in FIG. 4 is easy to detect in a visual manner if the entire signal voltage is depicted, it can be very difficult to detect in an automated manner using cost-efficient and practical hardware and software. The methodology presented here represents a practical solution that can detect and identify the source (location) of ground offsets in a CAN onboard a vehicle by sampling the CAN bus voltage at a reasonable frequency. In this regard, FIG. 5 is a flow chart that illustrates an exemplary embodiment of a bus voltage monitoring process 500, and FIG. 6 is a flow chart that illustrates an exemplary embodiment of a message timestamping and analysis process 600. The various tasks performed in connection with an illustrated process may be performed by software, hardware, firmware, or any combination thereof. For illustrative purposes, the following description of the processes 500, 600 may refer to elements mentioned above in connection with FIGS. 1-4. It should be appreciated that an illustrated process may include any number of additional or alternative tasks, the tasks shown in the figures need not be performed in the illustrated order, and an illustrated process may be incorporated into a more comprehensive procedure or process having additional functionality not described in detail herein. Moreover, one or more of the tasks could be omitted from an embodiment of a described process as long as the intended overall functionality remains intact.

In certain exemplary embodiments, the processes 500, 600 are executed independently and in parallel with each other (assuming that the process 600 has been initiated). In this regard, the tasks associated with the process 500 can be executed by a first processing routine or thread, and the tasks associated with the process 600 can be executed by a second processing routine or thread, wherein the two routines/threads are independently executed in a concurrent and parallel manner. The process 500 samples the signal voltage present on the CAN bus, checks the measured voltage for an indication of a ground offset state, and saves timestamps for voltage measurements that indicate a ground offset. The process 600 timestamps messages, compares the message timestamps against the saved voltage timestamps, and attempts to correlate the "abnormal" voltage measurements to a particular message and to an ECU that originated the particular message.

Referring to FIG. 5, the bus voltage monitoring process 500 measures the signal voltage that is present on the communication bus (task 502) and timestamps the measured voltage as it is read (task 504). The timestamping utilizes a reference clock that can be maintained by the diagnostic system 104 or by a module onboard the host vehicle. The voltage timestamp obtained at task 504 identifies the time at which the measured voltage was read. The process 500 continues by checking whether or not the measured signal voltage is indicative of a ground offset condition, state, or characteristic (query task 506). For this particular embodiment, the process 500 compares the measured signal voltage to a predetermined threshold voltage. Measured signal voltages that exceed the stated threshold voltage are assumed to be caused by a ground offset. For the scenario depicted in FIG. 4, a threshold voltage of 3.7 volts is utilized for CAN High and 2.8 volts for CAN Low to capture offset messages.

If the measured signal voltage is greater than the threshold voltage (the "Yes" branch of query task 506), then the process 500 assumes that the detected signal voltage is indicative of a ground offset condition. The process 500 may check whether or not the detected ground offset condition is the "initial" detection (query task 508). If so (the "Yes" branch of query task 508), then the message timestamping and analysis process 600 can be initiated (task 510) and the process 500 continues to task 512. If not (the "No" branch of query task 508), then the process 500 bypasses task 510 and proceeds to task 512. It should be appreciated that task 510 (which is optional) serves as a trigger to start the process 600. This trigger can be desirable to conserve processing resources and memory under normal operating conditions when all measured signal voltages are normal. Thus, the process 600 is performed only when needed, i.e., only when an offset signal voltage has been detected.

This example assumes that the signal voltage measurement exceeds the threshold and, therefore, the process 500 continues by identifying the signal voltage measurement and saving its corresponding timestamp (referred to herein as the "voltage timestamp") to a buffer or any suitable memory structure (task 512). The buffer can be managed as needed to maintain any desired number of voltage timestamps. Although not required, the signal voltage measurements can also be saved in association with their respective voltage timestamps, such that the measured signal voltages are recorded as being indicative of a ground offset condition.

The process 500 is performed in an ongoing and iterative manner until the diagnostic operation is complete. Accordingly, FIG. 5 shows task 512 leading back to task 502, which again measures the signal voltage at the next sampling time. Thus, the process 500 can be repeated to collect multiple voltage timestamps that correspond to detected signal voltages that are indicative of a ground offset state. Notably, the process 500 need not attempt to sample each and every message that appears on the bus. Although it is possible to do so, measuring the signal voltages of all messages would not be practical or economical. In accordance with certain embodiments, task 502 is performed at a rate that is about four or five times less than the average rate of message transmission. If the process 500 is repeated over a long enough period of time (for example, several minutes), then the likelihood of detecting ground offsets is very high, even though all of the messages will not be sampled over that period of time. In other words, task 502 will eventually capture offset signal voltages because a ground offset in an ECU will remain persistent or worsen over time.

Referring now to FIG. 6, the message timestamping and analysis process 600 may begin by reading messages on the bus and adding respective timestamps (referred to herein as "message timestamps") to the messages (task 602). The timestamping performed at task 602 utilizes the reference clock that is also used for the voltage timestamps, and/or a clock that is synchronized with the reference clock. The message timestamp added at task 602 identifies the time an associated message was received. For the embodiment described herein, the message timestamp is aligned with the end of the message. Referring to FIG. 3, the end of each message occurs immediately after the spike in the signal voltage, which is caused by other ECUs acknowledging the message. In alternative embodiments, the message timestamp can be added to correspond to any convenient position relative to the duration of the message as long as the location is known and/or consistent.

Task 602 results in one or more messages having respective message timestamps associated therewith. The process 600 continues by comparing the saved voltage timestamps against the message timestamps (task 604). As mentioned above with reference to the process 500, the buffered voltage timestamps correspond to offset voltage readings that are potentially caused by an ECU having a ground offset. Accordingly, task 604 iterates through the buffer that contains the voltage timestamps to compare the saved voltage timestamps against a particular message timestamp. Alternatively, the process 600 can iterate through a plurality of different message timestamps to compare them against a particular voltage timestamp. Regardless of the manner in which the timestamps are compared, the process 600 searches for corresponding timestamps (query task 606).

For this example, query task 606 determines whether the difference between the message timestamp for a particular message and a saved voltage timestamp is less than a predetermined threshold value. The threshold value is selected based on the desired accuracy, processing time and efficiency, message transmission rate, average message length, and the like. The embodiment presented herein utilizes a threshold value of 250 microseconds for 500 kBd CANs, although effective and accurate results can be obtained with longer threshold values. The threshold value represents a "timestamp window" that indicates whether or not two timestamps are close enough in time for purposes of correlating an offset voltage measurement to a particular message. Thus, if the difference between a message timestamp and a voltage timestamp is less than 250 microseconds, then the process 600 assumes that the timestamps correspond to the same message. Otherwise, the process 600 assumes that the timestamps correspond to different messages.

If the timestamps do not correspond (the "No" branch of query task 606), then the process 600 checks the age of the voltage timestamp. If the voltage timestamp is too old (the "Yes" branch of query task 607), then the corresponding voltage timestamp entry is removed from the buffer memory (task 608) and the process 600 returns to task 602 to continue reading and timestamping messages. If the voltage timestamp is not aged (the "No" branch of query task 607), then its buffer entry is maintained and the process 600 returns to task 602 to continue reading and timestamping messages. In certain embodiments, voltage timestamps remain in the buffer for only 800 milliseconds. Consequently, the timestamp buffer rarely contains more than five to ten entries at any given time. It should be appreciated that the 800 millisecond limit is merely exemplary, and that other time limits can be used if so desired.

This description assumes that the process 600 finds a saved voltage timestamp that is closely aligned in time with a message timestamp (the "Yes" branch of query task 606). When this occurs, the associated message, i.e., the one having that particular message timestamp, is analyzed to obtain an identifier (task 610). As mentioned above, each message includes an identifier that is uniquely mapped to only one originating source (an ECU). Thus, task 610 reviews the content of the message and extracts the appropriate identifier. The process 600 continues by mapping the obtained identifier to its corresponding electronic device, which is a particular one of the onboard ECUs for this example (task 612).

The system maintains a ground offset counter for each ECU that can be a potential source of a ground offset. The process 600 increments the counter value for the ECU that is identified at task 612. The counter value can be incremented by any amount for each "hit", but is preferably advanced by one count per hit. Over the duration of the diagnostic check, a given counter may be incremented in response to an accurate detection of a ground offset, or it may be erroneously incremented due to noise, timing issues, synchronization issues, transmission delays, or the like. Nonetheless, a diagnostic check that spans at least several minutes should be effective at collecting accurate statistics (the counter values for each ECU) that can be interpreted to correctly indicate which ECUs, if any, have a ground offset.

The process 600 can identify at least one ECU as a ground offset source (task 616). This identification is based on the comparison of the timestamps, and it can be based on a statistical analysis of the counter values. In addition, the process 600 can prepare, create, and generate a suitably formatted output that identifies which ECU has a ground offset (task 618). Depending on the particular implementation of the diagnostic system, task 618 may generate one or more of the following, without limitation: a report that summarizes the findings; a diagnostic trouble code that indicates the ground offset condition; a display that includes the results, which may include a written summary, the counter values, or a graph; and an alert notification or message.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A computer-implemented method of locating a source of a ground offset in a network of electronic devices interconnected by a communication bus, the method comprising:
    detecting, by a processor device, signal voltages on the communication bus that are indicative of a ground offset condition;
    saving, in a memory structure associated with the processor device, voltage timestamps for the detected signal voltages, each detected signal voltage having a respective voltage timestamp associated therewith;

adding, by the processor device, message timestamps to messages on the communication bus, each message having a respective message timestamp associated therewith;

comparing, by the processor device, the message timestamps against the voltage timestamps to identify messages corresponding to the detected signal voltages, wherein a message timestamp close in time to a voltage timestamp indicates a correlation between a detected signal voltage and a particular message, wherein the comparing comprises determining whether a difference in time between a particular message timestamp for the particular message and a corresponding voltage timestamp is less than a threshold time value;

identifying, by the processor device, at least one of the electronic devices as a ground offset source, based on the comparing; and generating, by the processor device, an output including a diagnostic trouble code that indicates the at least one of the electronic devices identified as a ground offset source.

2. The method of claim 1, further comprising:
when the determined difference is less than the threshold value, analyzing the particular message to obtain an identifier; and
mapping the obtained identifier to a particular one of the electronic devices.

3. The method of claim 2, further comprising:
incrementing a counter value for the particular one of the electronic devices, wherein the identifying provides the counter value.

4. The method of claim 1, wherein the detecting comprises:
measuring signal voltages on the communication bus;
comparing the measured signal voltages to a threshold voltage; and
when a measured signal voltage is greater than the threshold voltage, recording the measured signal voltage as being indicative of the ground offset condition.

5. The method of claim 1, wherein:
the network of electronic devices is a controller area network (CAN) onboard a host vehicle.

6. A system for diagnosing a controller area network (CAN) onboard a host vehicle, the CAN comprising a plurality of electronic control units (ECUs) interconnected by a CAN communication bus, the system comprising:
a processor device; and
a storage medium associated with the processor device, the storage medium comprising processor-executable instructions that, when executed by the processor device, are capable of performing a method of locating a source of a ground offset in the CAN, the method comprising:
detecting, by the processor device, signal voltages on the CAN communication bus that are indicative of a ground offset condition;
saving, in a memory structure associated with the processor device, voltage timestamps for the detected signal voltages, each detected signal voltage having a respective voltage timestamp associated therewith;
adding, by the processor device, message timestamps to messages on the CAN communication bus, each message having a respective message timestamp associated therewith;
comparing, by the processor device, the message timestamps against the voltage timestamps to identify messages corresponding to the detected signal voltages, wherein a message timestamp close in time to a voltage timestamp indicates a correlation between a detected signal voltage and a particular message, wherein the comparing comprises determining whether a difference in time between a particular message timestamp for a particular message and a corresponding voltage timestamp is less than a threshold time value;
identifying, by the processor device, at least one of the ECUs as a ground offset source, based on the comparing; and
generating, by the processor device, an output including a diagnostic trouble code that indicates the at least one of the electronic devices identified as a ground offset source.

7. The system of claim 6, wherein the method performed by the processor-executable instructions further comprises:
when the determined difference is less than the threshold value, analyzing the particular message to obtain an identifier; and
mapping the obtained identifier to a particular one of the ECUs.

8. The system of claim 6, wherein the detecting comprises:
measuring signal voltages on the CAN communication bus;
comparing the measured signal voltages to a threshold voltage; and
when a measured signal voltage is greater than the threshold voltage, recording the sampled signal voltage as being indicative of the ground offset condition.

9. The system of claim 6, further comprising:
a central gateway module onboard the host vehicle and coupled to the ECUs via the CAN communication bus, wherein the central gateway module comprises the processor device and the storage medium.

10. The system of claim 6, further comprising:
a diagnostic tool external to the host vehicle and having an interface to establish communication with the CAN communication bus, wherein the diagnostic tool comprises the processor device and the storage medium.

11. A tangible and non-transitory computer readable storage medium having executable instructions stored thereon that, when executed by a processor device, are capable of performing a method of locating a source of a ground offset in a network of electronic devices interconnected by a communication bus, the method comprising:
detecting, by the processor device, signal voltages on the communication bus that are indicative of a ground offset condition;
saving, in a memory structure associated with the processor device, voltage timestamps for the detected signal voltages, each detected signal voltage having a respective voltage timestamp associated therewith;
adding, by the processor device, message timestamps to messages on the communication bus, each message having a respective message timestamp associated therewith;
comparing, by the processor device, the message timestamps against the voltage timestamps to identify messages corresponding to the detected signal voltages, wherein a message timestamp close in time to a voltage timestamp indicates a correlation between a detected signal voltage that is indicative of a ground offset condition and a particular message, wherein the comparing comprises determining whether a difference in time between a particular message timestamp for a particular message and a corresponding voltage timestamp is less than a threshold time value;

identifying, by the processor device, at least one of the electronic devices as a ground offset source, based on the comparing; and generating, by the processor device, an output including a diagnostic trouble code that indicates the at least one of the electronic devices identified as a ground offset source.

12. The storage medium of claim 11, wherein the method further comprises:

when the determined difference is less than the threshold value, analyzing the particular message to obtain an identifier; and mapping the obtained identifier to a particular one of the electronic devices.

13. The storage medium of claim 11, wherein the detecting comprises:

measuring signal voltages on the communication bus;

comparing the measured signal voltages to a threshold voltage; and when a measured signal voltage is greater than the threshold voltage, recording the sampled signal voltage as being indicative of the ground offset condition.

14. The storage medium of claim 11, wherein:

the network of electronic devices is a controller area network (CAN) onboard a host vehicle.

* * * * *